United States Patent
Abadeer et al.

(10) Patent No.: US 8,035,452 B2
(45) Date of Patent: Oct. 11, 2011

(54) STRUCTURE FOR TRANSFORMING AN INPUT VOLTAGE TO OBTAIN LINEARITY BETWEEN INPUT AND OUTPUT FUNCTIONS AND SYSTEM AND METHOD THEREOF

(75) Inventors: Wagdi W. Abadeer, Jericho, VT (US); John A. Fifield, Underhill, VT (US); Stephen D. Wyatt, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 554 days.

(21) Appl. No.: 12/057,686

(22) Filed: Mar. 28, 2008

(65) Prior Publication Data
US 2009/0243733 A1    Oct. 1, 2009

(51) Int. Cl.
*H03L 7/00* (2006.01)
*H03B 5/08* (2006.01)
*H03C 3/22* (2006.01)

(52) U.S. Cl. .... 331/34; 331/167; 331/177 R; 331/177 V

(58) Field of Classification Search .................. 331/16, 331/17, 34, 117 FE, 117 R, 167, 177 R, 177 V
See application file for complete search history.

(56) References Cited

U.S. PATENT DOCUMENTS

| | | | |
|---|---|---|---|
| 4,417,218 A | 11/1983 | Berke | |
| 4,970,472 A | 11/1990 | Kennedy et al. | |
| 5,857,109 A * | 1/1999 | Taylor | 712/37 |
| 6,285,263 B1 | 9/2001 | Anderson | |
| 6,353,370 B1 * | 3/2002 | Cox et al. | 331/117 R |
| 6,683,509 B2 * | 1/2004 | Albon et al. | 331/177 V |
| 7,015,766 B1 | 3/2006 | Guo et al. | |
| 7,187,247 B2 * | 3/2007 | Perry et al. | 331/177 V |
| 7,221,234 B2 * | 5/2007 | Chien | 331/177 V |
| 7,268,630 B2 | 9/2007 | Rhee et al. | |
| 7,317,363 B2 * | 1/2008 | Kousai et al. | 331/177 V |
| 7,327,195 B2 | 2/2008 | Sawada | |
| 2005/0190002 A1 * | 9/2005 | Takinami et al. | 331/117 R |
| 2007/0188249 A1 | 8/2007 | Abadeer et al. | |
| 2009/0195958 A1 * | 8/2009 | Vavelidis et al. | 361/281 |

* cited by examiner

*Primary Examiner* — Levi Gannon
(74) *Attorney, Agent, or Firm* — David Cain; Roberts Mlotkowski Safran & Cole, P.C.

(57) ABSTRACT

A design structure is embodied in a machine readable medium for designing, manufacturing, or testing a design. The design structure includes a first structure for determining a non-linear characteristic of the input voltage to the output frequency response, the first design structure providing a tunneling-based current relationship with the input voltage. Also disclosed is a system and a method of implementing such structure.

23 Claims, 20 Drawing Sheets

27C, Parameter C1 for Gate Tunneling Current Model Versus Oxide Thickness

27C, Parameter C2 for Gate Tunneling Current Model Versus Oxide Thickness

27C, Gate Tunneling Currents Versus Gate Voltage, $I_G = C_1 \times (V_G * C_2)$ 27C, TOX1 = 1.2nm, Various Values of TOX2, Gate Tunneling Current Parameter C2 for the Total Current IT Versus Area Ratio AR = A1 / A2, IT = C3 × (VG * C2)

27C, TOX1 = 1.4nm, Various Values of TOX2, Gate Tunneling Current Parameter C2 for the Total Current IT Versus Area Ratio AR = A1 / A2, IT = C3 × (VG * C2

27C, TOX1 = 1.7nm, Various Values of TOX2, Gate Tunneling Current Parameter C2 for the Total Current IT Versus Area Ratio AR = A1 / A2, IT = C3 × (VG * C2)

Varactor Capacitance CO Versus Voltage VOUT

Inductance L = 5nH, Output Frequency FF Versus Input Voltage Vin

27C, TOX1 = 1.9nm, TOX3 = 1.4nm, Percent Change in Power Index C5 Versus Percent Change in Oxide Thickness TOX1 or TOX3

27C, TOX1 = 1.9nm, TOX3 = 1.4nm, Percent Change in Power Index C5 Versus Percent Change in Oxide Thickness TOX1 or TOX3

27C, TOX1 = 1.9nm, TOX3 = 1.4nm, Percent Change in Power Index C5 Versus Percent Change in Oxide Thickness TOX1 and TOX3 TOX1 and TOX3 Changing with Equal Percentage 27C, TOX1 = 1.9nm, TOX3 = 1.4nm, Percent Change in Power Index C5 Versus Percent Change in Oxide Thickness TOX1 and TOX3 TOX1 and TOX3 Changing with Equal Percentage 27C, TOX1 = 1.9nm, TOX3 = 1.4nm, Percent Change in Power Index C5 Versus Percent Change in Oxide Thickness TOX1 or TOX3

27C, TOX1 = 1.9nm, TOX3 = 1.4nm, Percent Change in Power Index C5 Versus Percent Change in Oxide Thickness TOX1 or TOX3

STRUCTURE FOR TRANSFORMING AN INPUT VOLTAGE TO OBTAIN LINEARITY BETWEEN INPUT AND OUTPUT FUNCTIONS AND SYSTEM AND METHOD THEREOF

FIELD OF THE INVENTION

The present invention generally relates to a design structure for transforming an input voltage to obtain linearity between input and output functions of a circuit or a system associated with the input voltage, and a system and method for linearizing an input voltage to an output frequency response of a voltage controlled oscillator.

BACKGROUND OF THE INVENTION

In many applications, it is highly desirable to make the output function of a particular circuit or system have a linear relationship with the input function of the circuit. For example, one can make a circuit or device that produces a capacitance whose value depends on an input voltage. In this case, it is desirable that the capacitance value behaves linearly with the input voltage. Another example relates to phase-locked loop (PLL) circuits which contain a voltage controlled oscillator (VCO) whose output frequency is a function of an input control voltage. In such circuits, it is also desirable that the output frequency behave linearly with respect to the input control voltage.

There are many known techniques for linearizing the input/output response of VCOs in PLL circuits. Such techniques typically utilize circuit methods which can be very complex. Other techniques divide the frequency range to several ranges and employ different circuit and computational techniques to linearize each frequency range.

It is also known to utilize gate tunneling current with gate voltages less than 3V (volts) in devices with ultra-thin gate oxides, i.e., those which have gate oxide thickness less than about 4.5 nm. The gate current (Ig) can be expressed as a power function of the gate voltage (Vg) as follows:

$$Ig = C1 \times Vg^{C2} \quad (1)$$

FIG. 1 graphically depicts the relationship between parameter C1 in amps per centimeter squared (AMP/cm$^2$) versus oxide thickness at 27 C (27 degrees Celsius).

FIG. 2 graphically depicts the relationship between parameter C2 versus oxide thickness. As is apparent from FIGS. 1 and 2, parameters C1 and C2 are functions of gate voltage and can be written as functions of oxide thickness (TOX). The range of TOX employed here is 3.5 nm to 1.2 nm. This range is selected as a practical case for the tunneling current as function of the gate voltage. The parameters C1 and C2 could be represented as follows:

$$C1 = 4.8385 \times 10^8 \times \text{Exp}[-1.301 \times TOX] \quad (2)$$

$$C2 = 1.0611 + [1.5863 \times TOX] \quad (3)$$

The range of C2 corresponds to the TOX range, is from about 3.0 to about 6.7, and is a wide range.

The gate voltage Vg can be expressed as a function of Ig as follows:

$$Vg = A1 \times Ig^{A2} \quad (4)$$

where:

$$A1 = (1/C1)^{(1/C2)} \quad (5)$$

and, $$A2 = 1/C2. \quad (6)$$

There exists a need in the art for a better technique and an associated circuit through which the relationship between the output and input functions can be transformed into a linear one.

SUMMARY OF THE INVENTION

In a first aspect of the invention, a structure is embodied for linearizing an input voltage to an output frequency response of a voltage controlled oscillator (VCO) wherein the structure includes a first structure for determining a non-linear characteristic of the input voltage to the output frequency response. The first design structure provides a tunneling-based current relationship with the input voltage.

In an additional aspect of the invention, a method for linearizing an input voltage to an output frequency response of a voltage controlled oscillator includes determining a non-linear characteristic of the input voltage to the output frequency response and providing a tunneling-based current that is related to the input voltage. The method establishes a relationship between the input voltage and the output frequency of the VCO.

In a further aspect of the invention, a design structure is embodied in a machine readable medium for designing, manufacturing, or testing an integrated circuit. The design structure includes a design structure for determining a non-linear characteristic of the input voltage to the output frequency response. The design structure provides a tunneling-based current relationship with the input voltage.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF THE INVENTION

Figure 1:
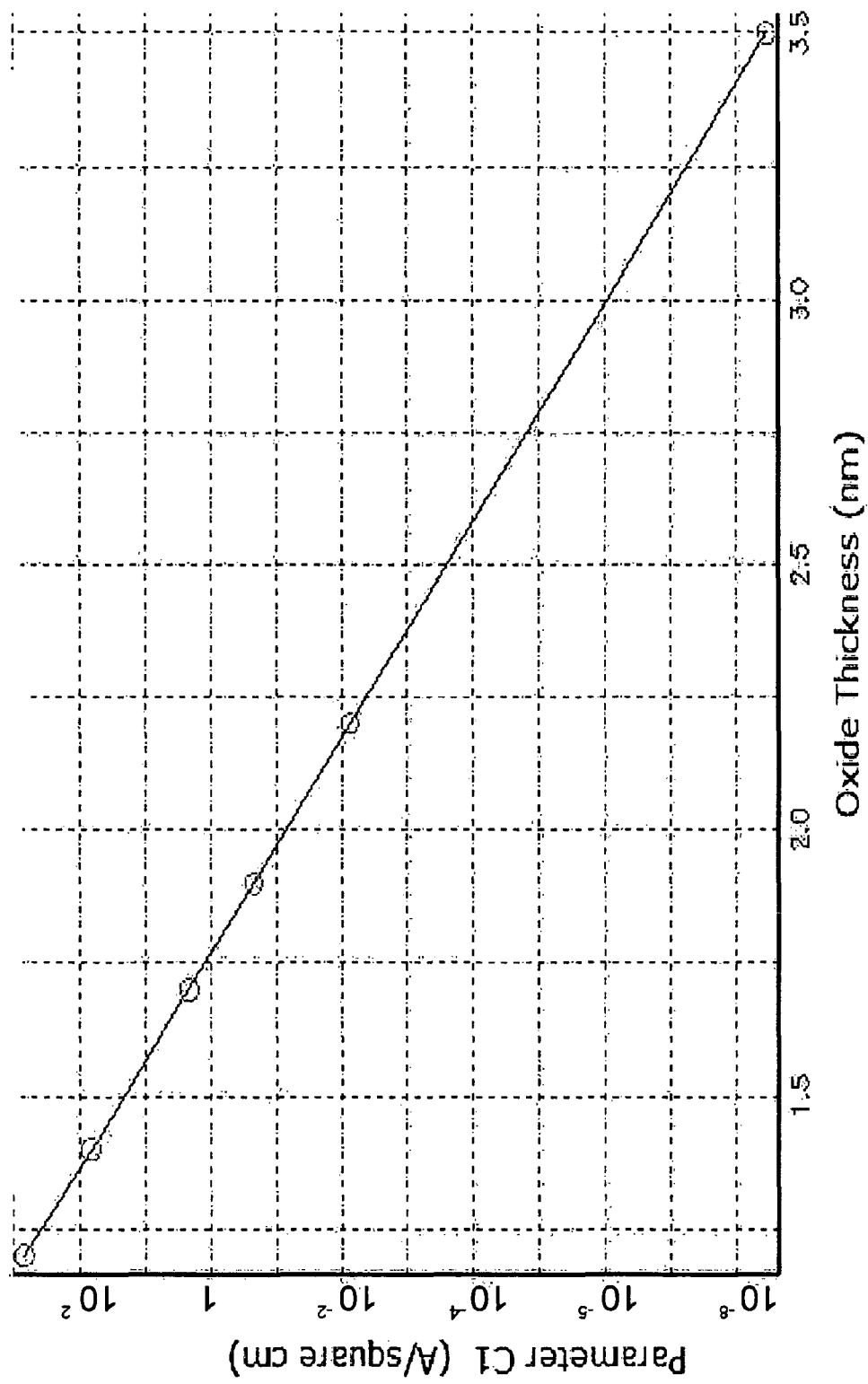
FIG. 1 graphically depicts the relationship between parameter C1 in amps per centimeter squared (A/cm$^2$) versus oxide thickness at 27 C.
Figure 2:
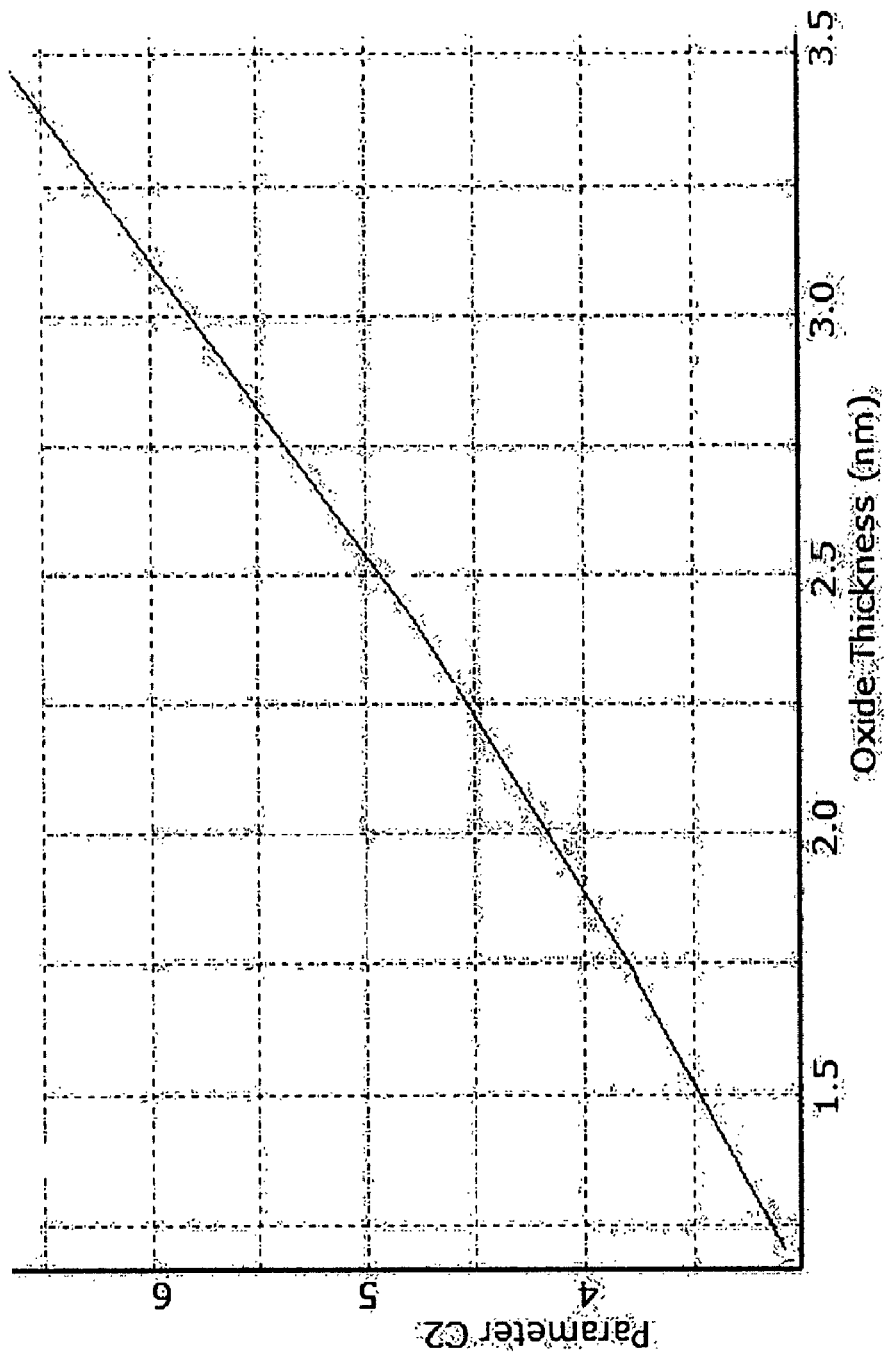
FIG. 2 graphically depicts the relationship between parameter C2 versus oxide thickness.

This invention relates to a technique and an associated circuit through which the relationship between the output and input functions can be transformed into a linear one. The present invention also generally relates to transforming an input voltage to obtain linearity between input and output functions of a circuit or a system associated with the input voltage. The invention also relates to transforming an input voltage to obtain linearity between input and output functions of a circuit or a system associated with the input voltage that is embodied in a machine readable medium for designing, manufacturing, or testing an integrated circuit. The invention also relates to circuits for implement the method of the present invention. The circuits may utilize NFETs, PFETs, and/or devices having ultra-thin gate oxides biased in inversion or accumulation mode conditions.

The present invention also generally relates to a design structure embodied in a machine readable medium for linearizing an input voltage to an output frequency response of a voltage controlled oscillator. The design structure may comprise a first design structure for determining a non-linear characteristic of the input voltage to the output frequency response. The first design structure provides a tunneling-based current inverse characteristic of the input voltage to the output frequency response. The procedure also includes coupling an inverse characteristic between the input voltage and the voltage controlled oscillator, whereby the combination of the inverse characteristic and voltage controlled oscillator provides a linear characteristic between the input voltage and the output frequency.

In a typical VCO circuit, the relationship between the output frequency and the input voltage is non-linear. However, if the input voltage is transformed into a control voltage which is a nonlinear function of the input voltage, it is possible to make the output frequency linear with the input voltage.

The invention utilizes the non linear functional dependency of gate tunneling current for ultra-thin gate oxide on gate voltage. An input voltage applied to the gate of an ultra-thin gate oxide device will cause a gate tunneling current, which can be expressed as a power function of the applied gate voltage. The exponent or index of this power function can be controlled in value by the oxide thickness or by summing currents from more than one tunneling device, subject to the same input gate voltage. The ratio of the oxide area of these tunneling devices will also control the power index of the output current. The gate current can then be applied to an output load and the output voltage can then be expressed as a power function of the input voltage. This transformation of the functional form of the output voltage can then be utilized, for example, in a VCO circuit, wherein the output voltage is used as a control voltage and the output frequency of the circuit can be made linear with the input voltage.

Structure and Fabrication Processes

With reference to FIGS. 3-9, it will be apparent that the sum of two gate currents I1 and I2 of two tunneling devices (NFET1 and NFET2), subject to the same gate voltage Vin, is a power function of Vin with a power index N1, as follows:

$$IT = I1 + I2 \quad (7)$$

$$IT = C3 \times Vin^{C2} \quad (8)$$

The exponent C2 is controlled by the oxide thickness TOX1 and TOX2 of the tunneling devices and the area ratio AR of the two oxide areas A1 and A2. C3 is a function of C1 and C2 and is determined by the value of IT. The input voltage Vin is the same as the gate voltage Vg.

Figure 3:
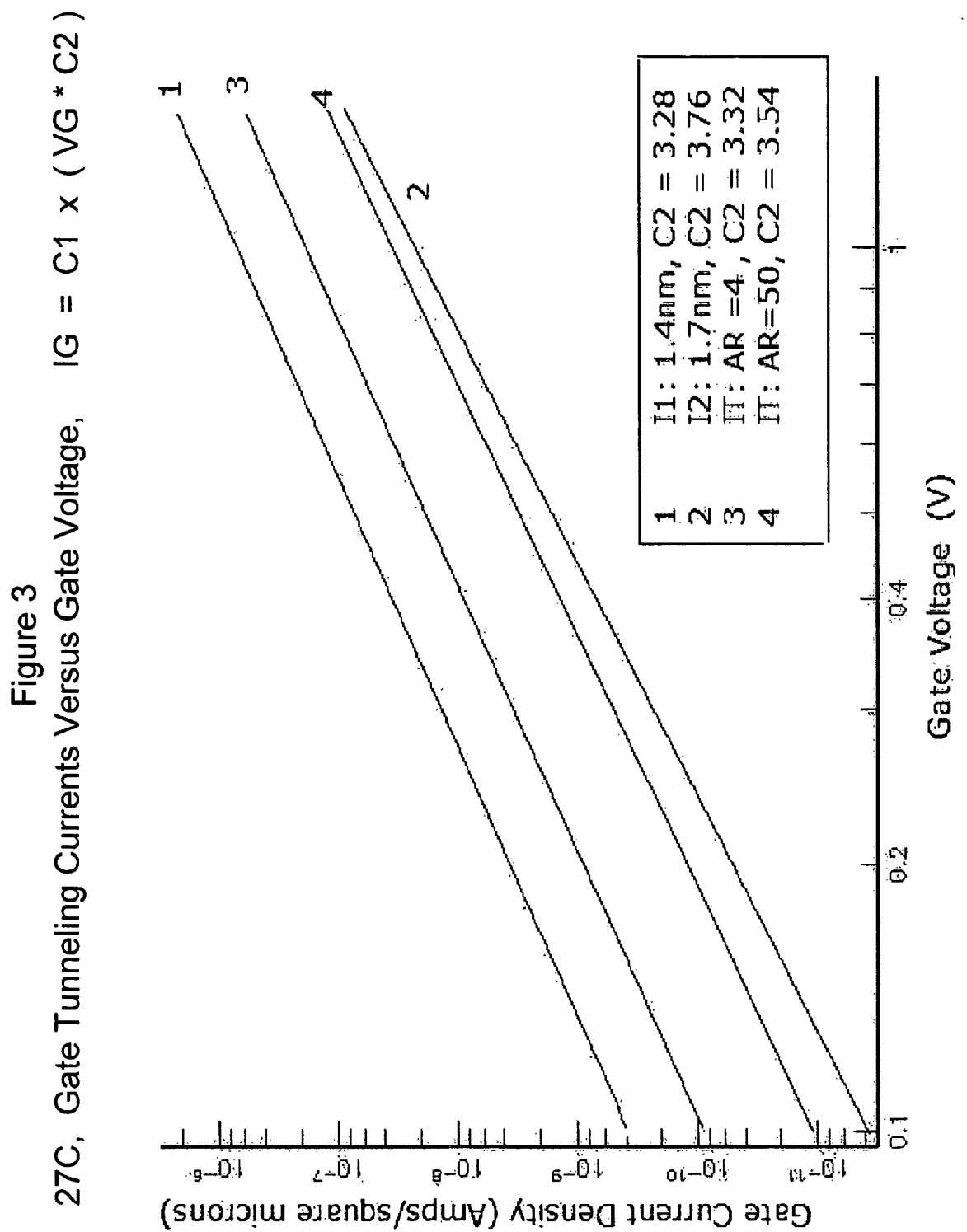
FIG. 3 graphically illustrates gate currents I1, I2, and total current IT versus gate voltage for TOX1=1.4 nm, TOX2=1.7 nm and different values of area ratio AR according to the present invention.
Figure 4:
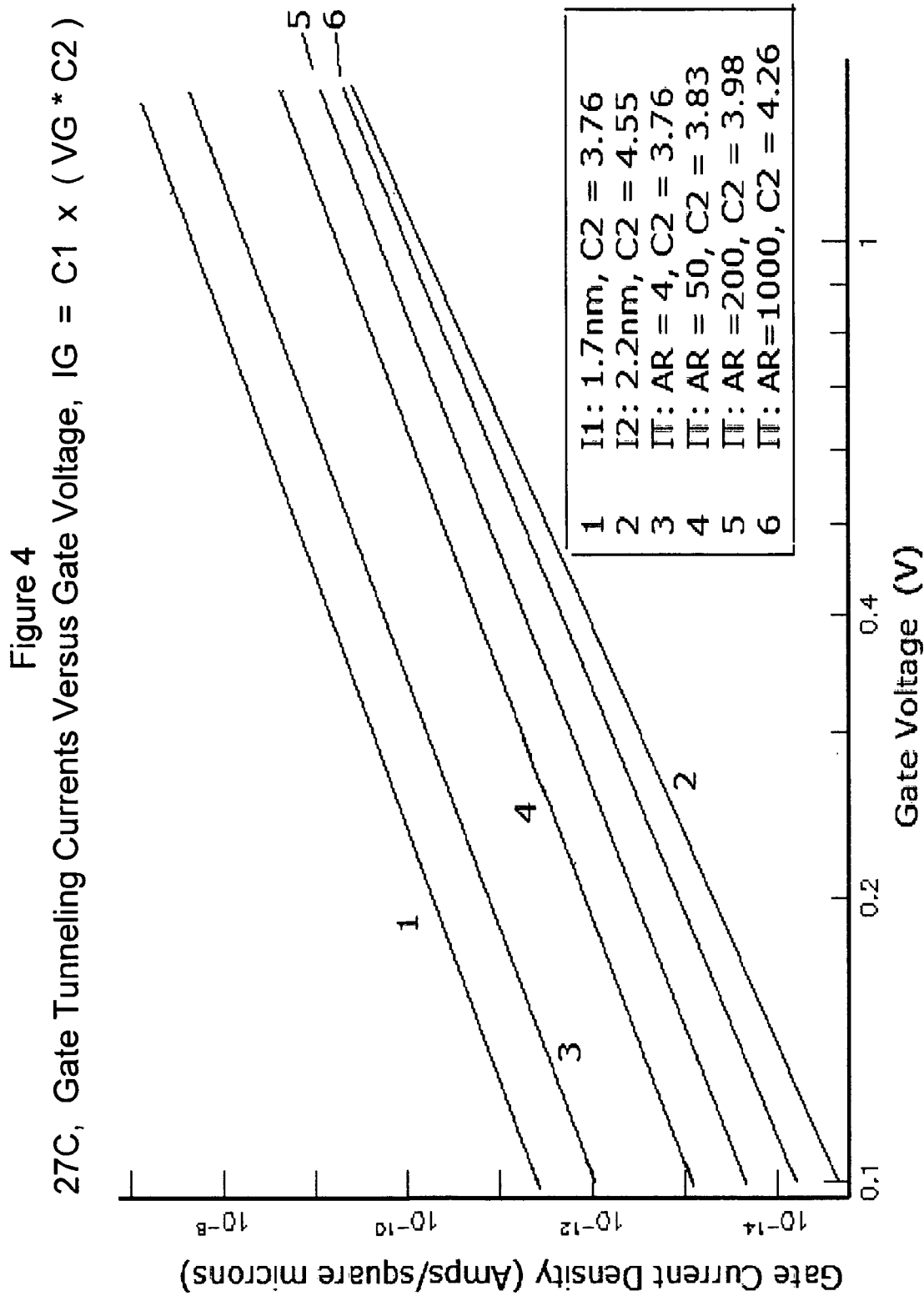
FIG. 4 graphically depicts gate currents I1, I2, and total current IT versus gate voltage for TOX1=1.7 nm, TOX2=2.2 nm and different values of area ratio AR according to the present invention.
Figure 5:
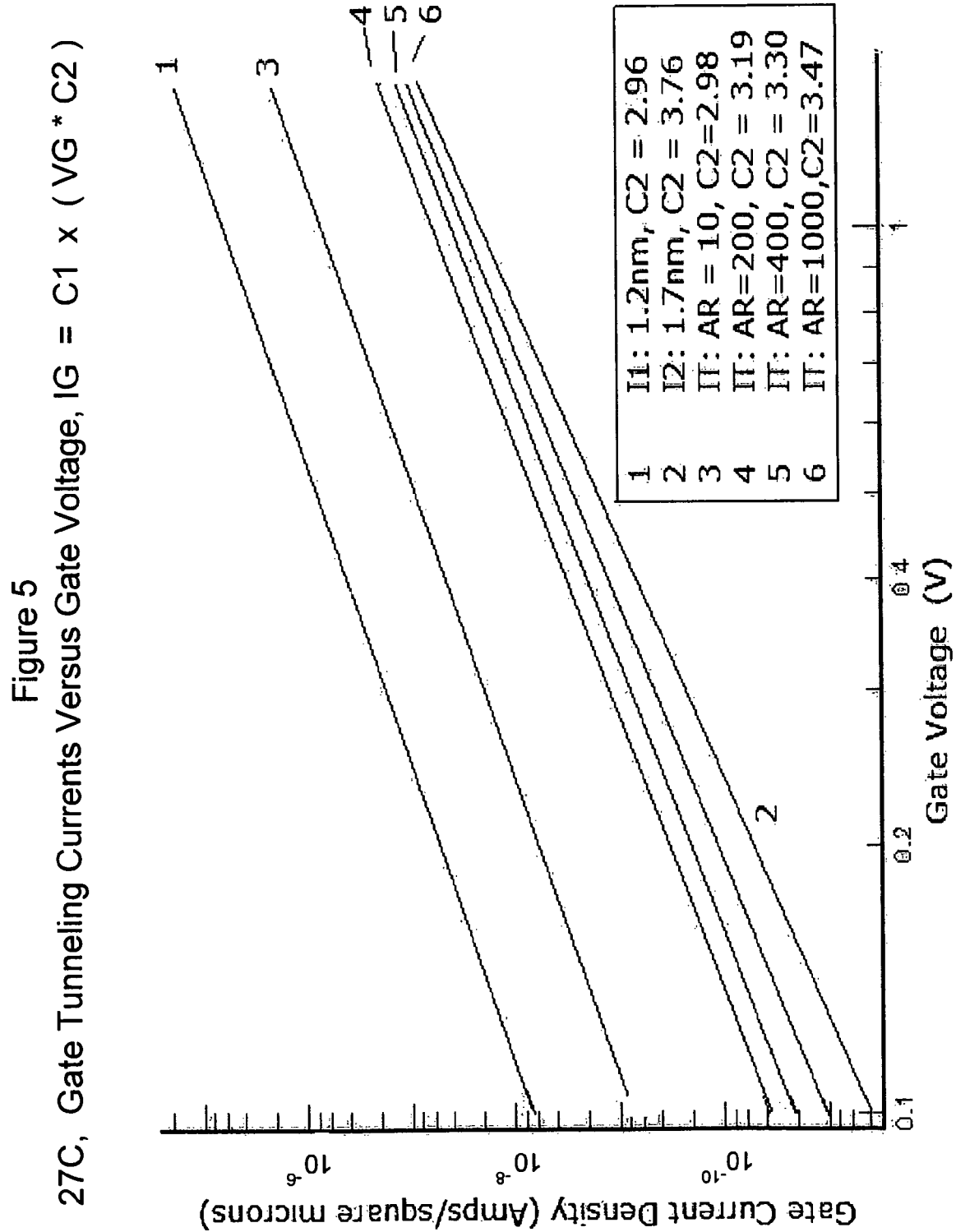
FIG. 5 graphically depicts gate currents I1, I2, and total current IT versus gate voltage for TOX1=1.2 nm, TOX2=1.7 nm and different values of area ratio AR according to the present invention.

FIGS. 3-5 show the I/V characteristics for I1, I2 and the total current IT (at 27 C) for different values of TOX1, TOX2 and AR. These results show that, similar to I1 and I2, the total current IT has a power Function that depends on the gate voltage Vg.

More specifically, in FIG. 3, TOX1 and TOX2 are respectively 1.4 nm and 1.7 nm (C2=respectively 3.28 and 3.76). FIG. 3 shows that as the area ratio AR increases from a value of 4 to 50, the power exponent C2 for the total current IT varies from a value (C2=3.32) close to the value of C2 representing the current I1, i.e., C2=3.28, to a value (C2=3.54) closer to that representing the current I2, i.e., C2=3.76.

In FIG. 4, TOX1 and TOX2 are respectively 1.7 nm and 2.2 nm (C2=respectively 3.76 and 4.55). FIG. 4 shows that as the area ratio AR increases from a value of 4 to 50 to 200 to 1000, the power exponent C2 for the total current IT varies from a value (C2=3.76) close to the value of C2 representing the current I1, i.e., C2=3.76, to a value (C2=4.26) closer to that representing the current I2, i.e., C2=4.55.

In FIG. 5, TOX1 and TOX2 are respectively 1.2 nm and 1.7 nm (C2=respectively 2.96 and 3.76). FIG. 5 shows that as the area ratio AR increases from a value of 10 to 200 to 400 to 1000, the power exponent C2 for the total current IT varies from a value (C2=2.98) close to the value of C2 representing the current I1, i.e., C2=2.96, to a value (C2=3.47) closer to that representing the current I2, i.e., C2=3.76.

Figure 6:
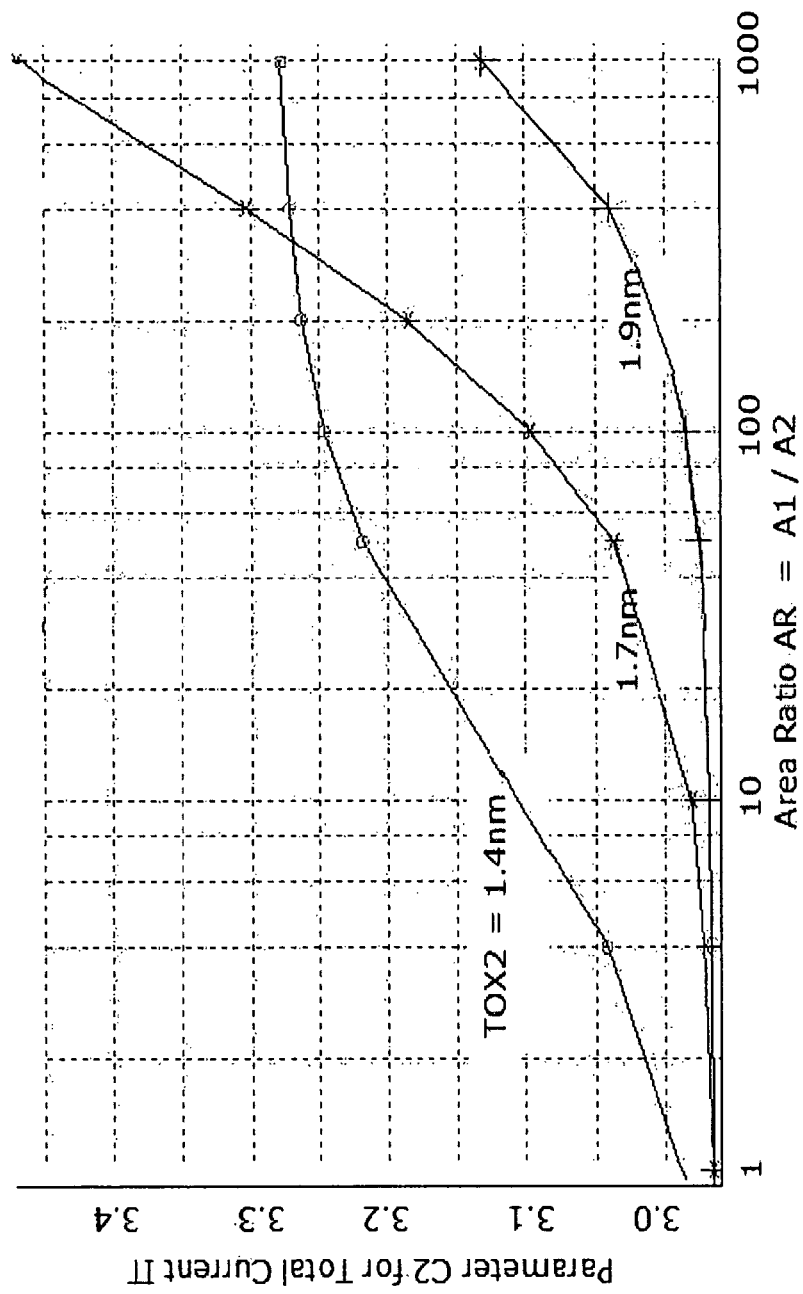
FIG. 6 graphically depicts power exponent C2 for total current IT versus area ratio AR for TOX1=1.2 nm, and different values of TOX2 according to the present invention.
Figure 7:
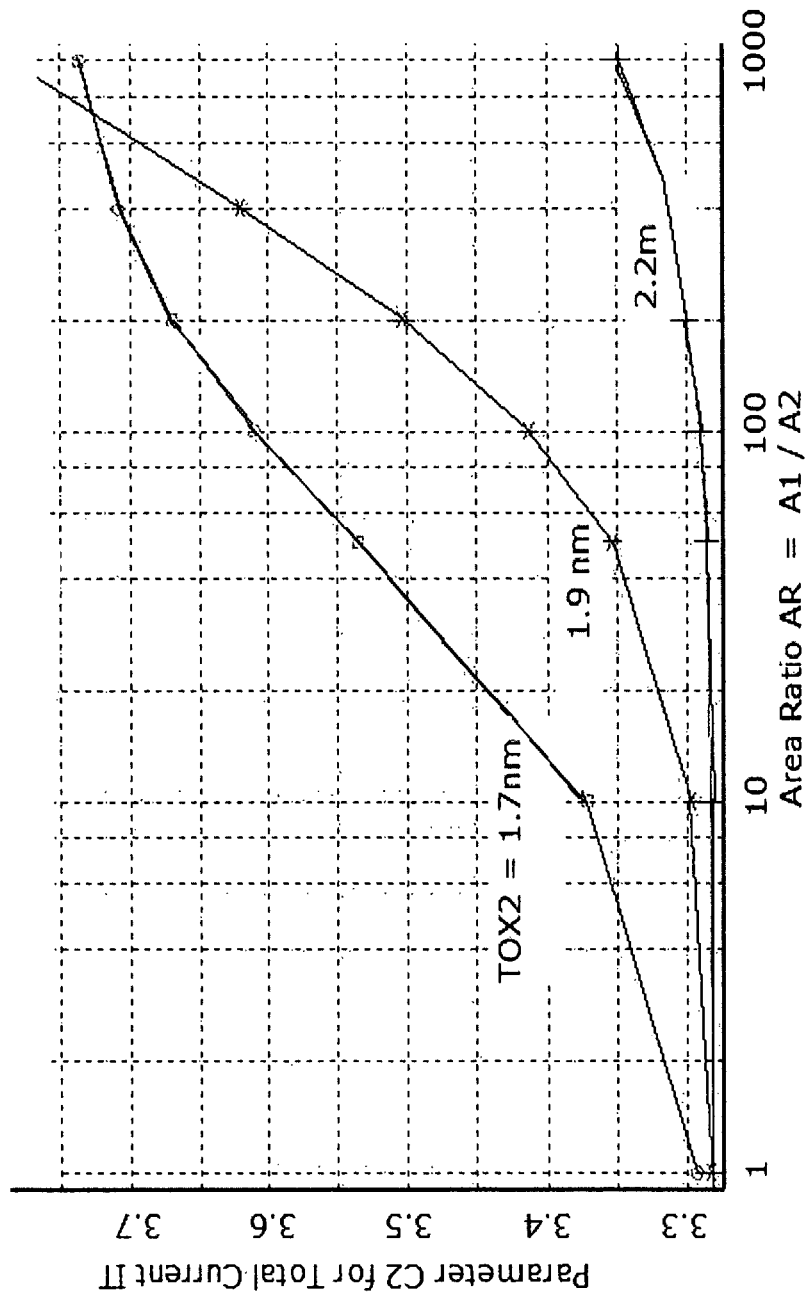
FIG. 7 graphically depicts power exponent C2 for total current IT versus area ratio AR for TOX1=1.4 nm and different values of TOX2 according to the present invention.
Figure 8:
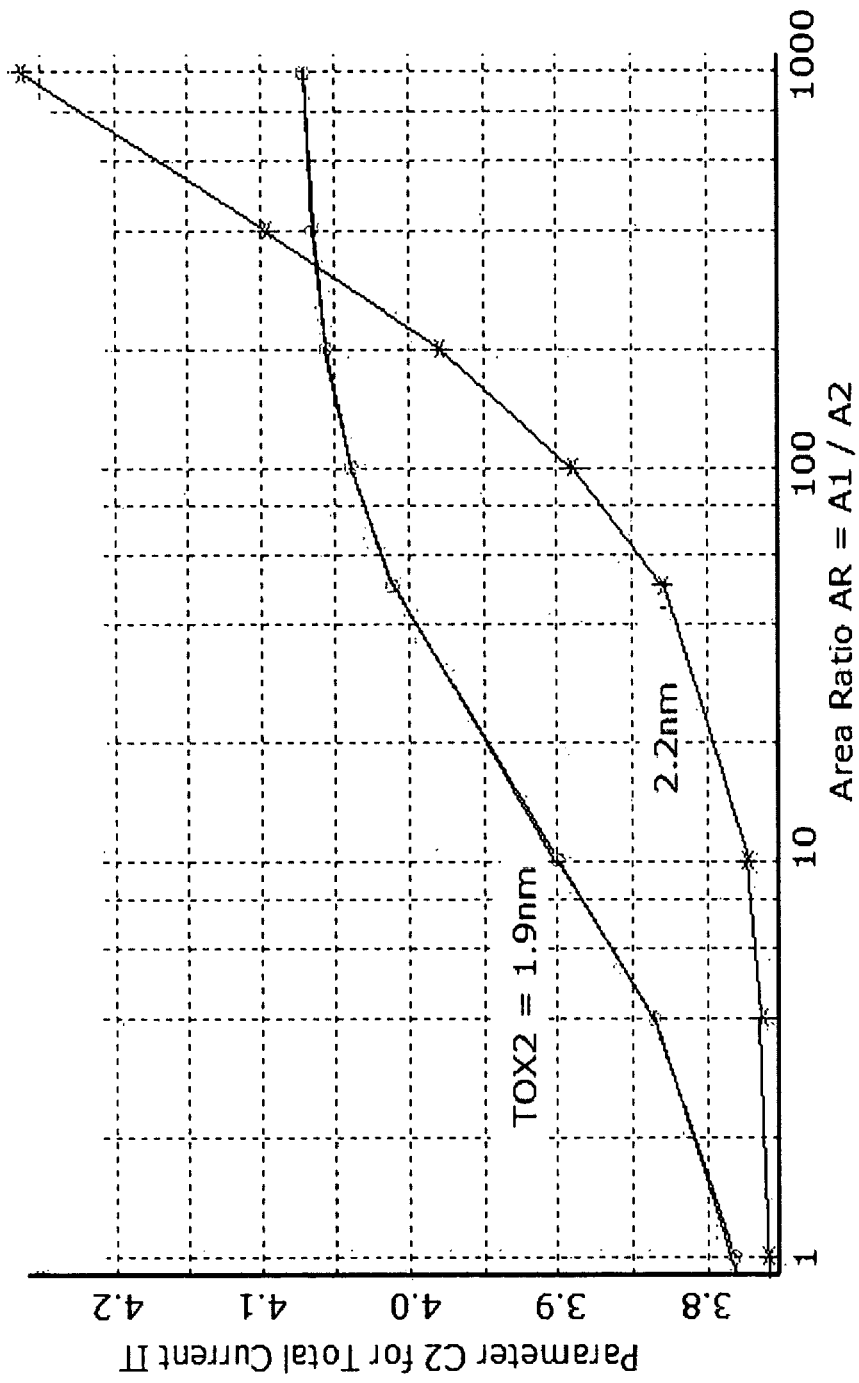
FIG. 8 graphically depicts power exponent C2 for total current IT versus area ratio AR for TOX1=1.7 nm and different values of TOX2 according to the present invention.

FIGS. 6-8 show the value of the exponent C2 for the total current IT versus the area ratio AR, for different cases of TOX1, TOX2, and AR. FIG. 6 shows the case for TOX1=1.2 nm, and three different values of TOX2; 1.4 nm, 1.7 nm, and 1.9 nm. FIGS. 7 and 8 respectively show the cases for TOX1 of 1.4 nm and 1.7 nm.

Figure 9:
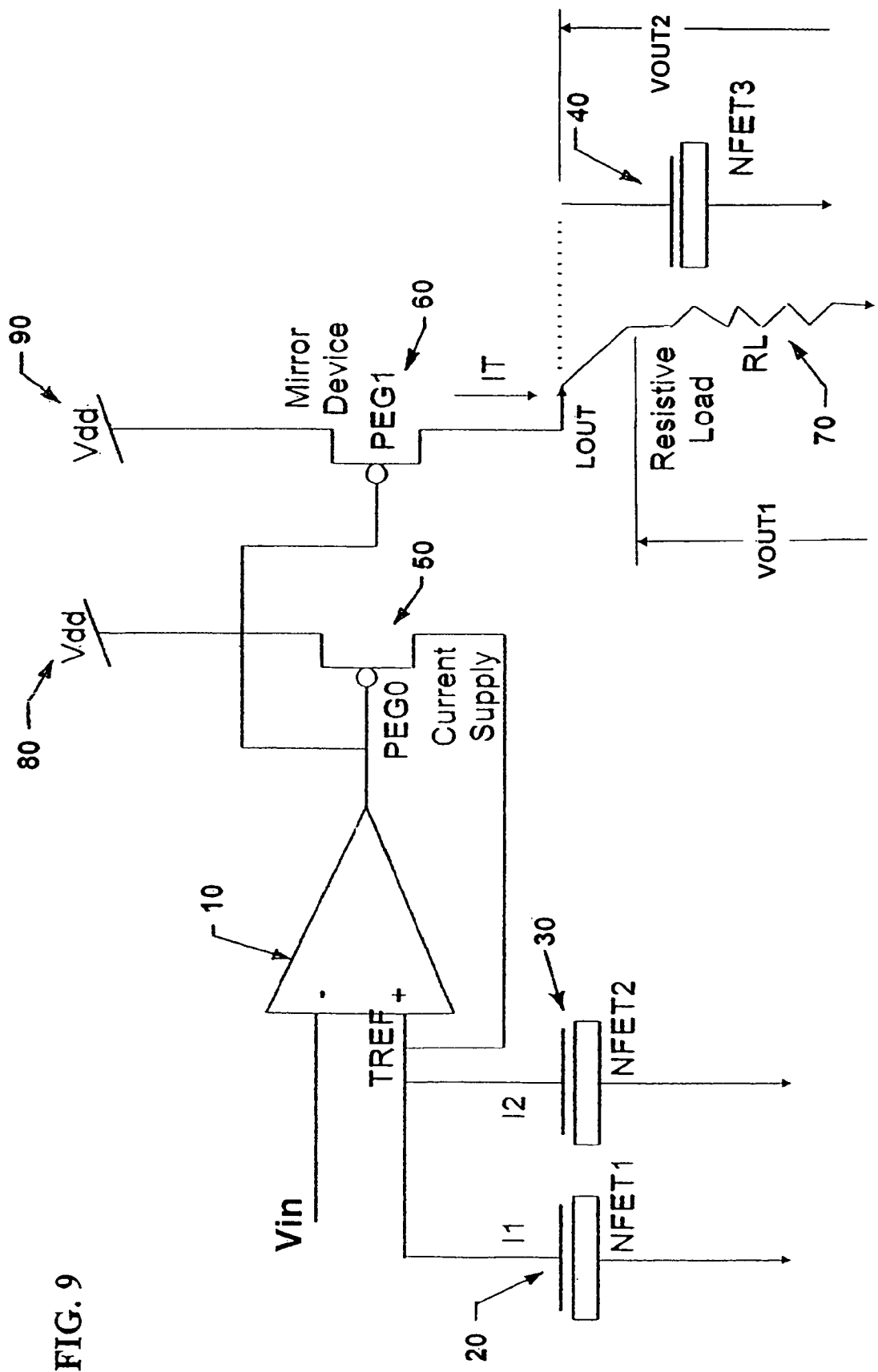
FIG. 9 shows a circuit according to the present invention.

FIG. 9 shows a circuit according to one non-limiting aspect of the invention. The circuit can be implemented in many forms but is preferably formed on the semiconductor device. The circuit includes a unity gain op-amp 10, which can be of the type made according to well known semiconductor fabrication techniques. The circuit also utilizes NFET1 20, NFET2 30, and optional NFET3 40. These devices have a gate electrically connected to different voltages. All other terminals of these devices 20, 30 and 40 are connected to ground. The gate current passing through each device 20, 30 and 40 is a gate tunneling current. The circuit also includes a pass gate or pass transistor (PEG0) 50, as well as a PFET (PEG1) 60 which functions as a current mirror or mirror device. Both devices 50 and 60 can be made according to well known semiconductor fabrication techniques. The circuit additionally utilizes a resistive load (RL) 70, which can be made according to well known semiconductor fabrication techniques. Finally, the circuit utilizes power supplies 80 and 90, which can be made according to well known semiconductor fabrication techniques.

Again with reference to FIG. 9, an input voltage Vin is connected and/or applied to a negative terminal of the unity gain op-amp 10. This voltage Vin can be in the range of between about 1 volts and about 5 volts. The PEG0 50 is connected to an output terminal of the op-amp 10. The pass transistor or PEG0 50 supplies a tunnel current to the two NFET devices 20 and 30 in the form of currents I1 and I2 which can be in the range of between about 1 nano-amps and about 10 micro-amps. The op-amp 10 and PEG0 50 are configured in negative-feedback mode to make node TREF or reference voltage (at the positive terminal of the op-amp 10) essentially the same as the input voltage Vin.

If for example, TREF voltage is lower than input voltage Vin upon initialization of the power supply 80 supplying voltage Vdd, the (+) input to the op-amp 10 will be lower than the (−) input voltage Vin, and the op-amp output voltage will drop. This will cause the PFET pass gate or PEG0 50 to conduct more, and raise the potential of node TREF until TREF is equal to node Vin. As a result, the op-amp circuit attains equilibrium.

If an AC signal (having the form of a sinusoidal signal) is applied to node Vin of the op-amp 10, the op-amp 10 will adjust the voltage on node TREF and track the voltage of node Vin. The AC response of the op-amp 10 can, of course, be tuned to respond to a desired lag, or settling time for a given application. The other power supply 90 supplies the voltage Vdd to the device 60. Both voltages can be in the range of between about 1 volt and about 5 volts.

The output terminal of the op-amp 10 controls the conduction of pass gate or PEG0 50, and is used to form a current mirror with a PFET or PEG1 60. As long as PEG0 50 and PEG1 60 are biased in the saturation region, the currents (IT) passing through them will be essentially equal. With the current mirror, the tunneling current is mirrored from PEG0 50 to PEG1 60 so that whatever current flows into the tunnel devices 20 and 30 will be mirrored into the load 70 as current IT.

The dotted line shown in FIG. 9 illustrates how the mirrored tunnel current IT can be directed into a load, such as an NFET3 40, which will develop a voltage at node LOUT which is predicted as a function of tunnel current IT. The circuit of the invention thus transforms an input voltage Vin to a voltage which is a function of tunnel current IT at node LOUT. The resistance of the resistive load RL is a function of the total current (IT) to give an output voltage of at least 100 milli-volts.

Figure 10:
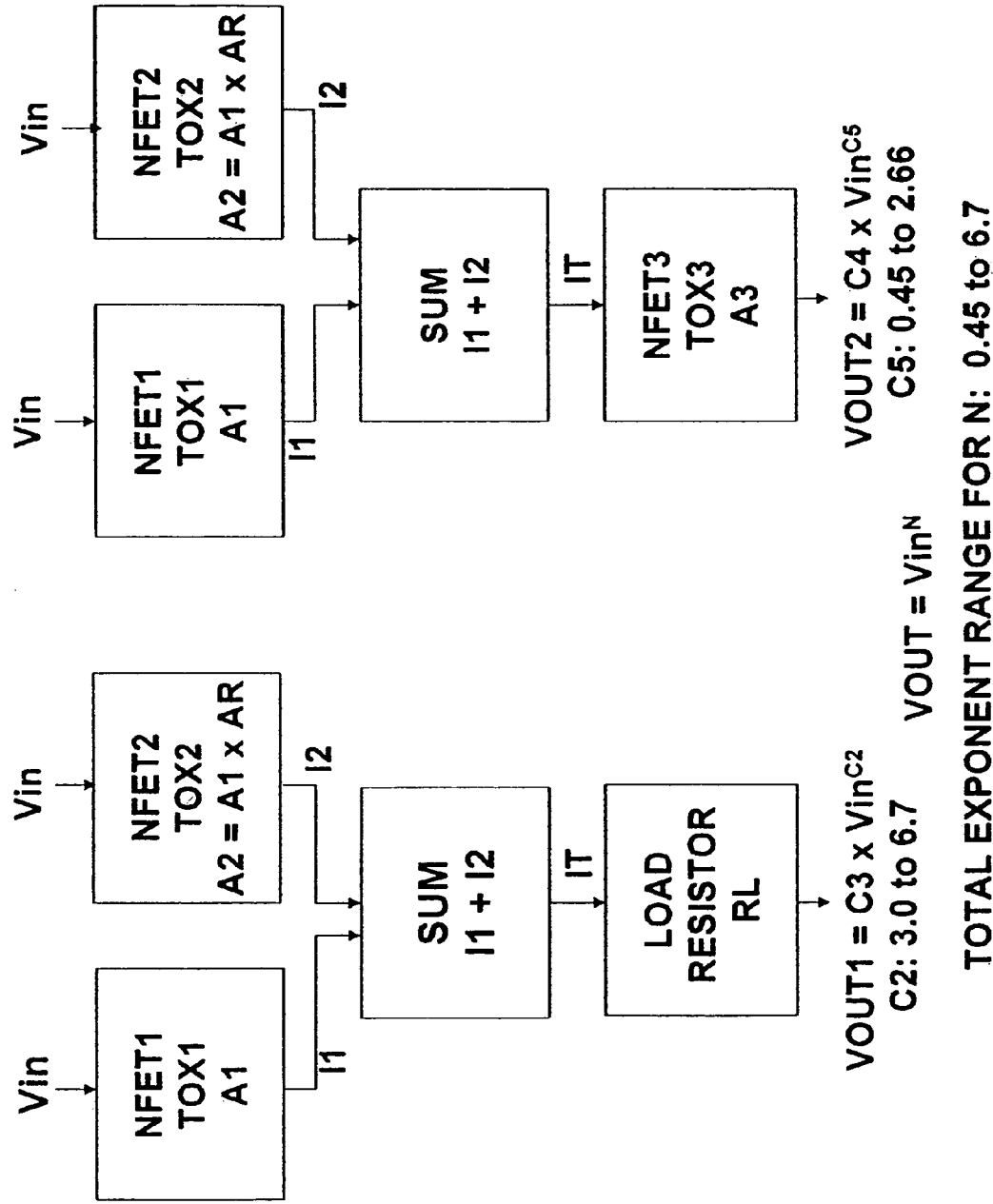
FIGS. 10 and 11 show flow charts according to the present invention.

A block diagram representation of the invention is shown in FIG. 10. With reference to FIGS. 9 and 10, the voltage VOUT1 (i.e., the voltage across resistor RL) is given by $$VOUT1 = C3 \times Vin^{C1} \times RL \tag{9}$$

The range of the exponent C1 in this case varies in value from about 3.0 to 6.7.

The output voltage VOUT2 (i.e., the voltage across NFET3) from equations (4) and (6) discussed above is given by:

$$VOUT2 = A1 \times IT^{A2} \tag{10}$$

Substituting with equation (8) discussed above, one obtains:

$$VOUT2 = A1 \times [C3 \times Vin^{C2}]^{A2} \tag{11}$$

Equation (11) can be written as:

$$VOUT2 = C4 \times Vin^{C5} \tag{12}$$

The range of the exponent C5 is now from about 0.45 to 2.66. C4 is a function of VOUT2. Thus, in general the output voltage can be written as;

$$VOUT = C \times Vin^{N} \tag{13}$$

The total range of the exponent N for the output voltage is from about 0.45 to 6.7 which is quite a wide range.

Figure 11:
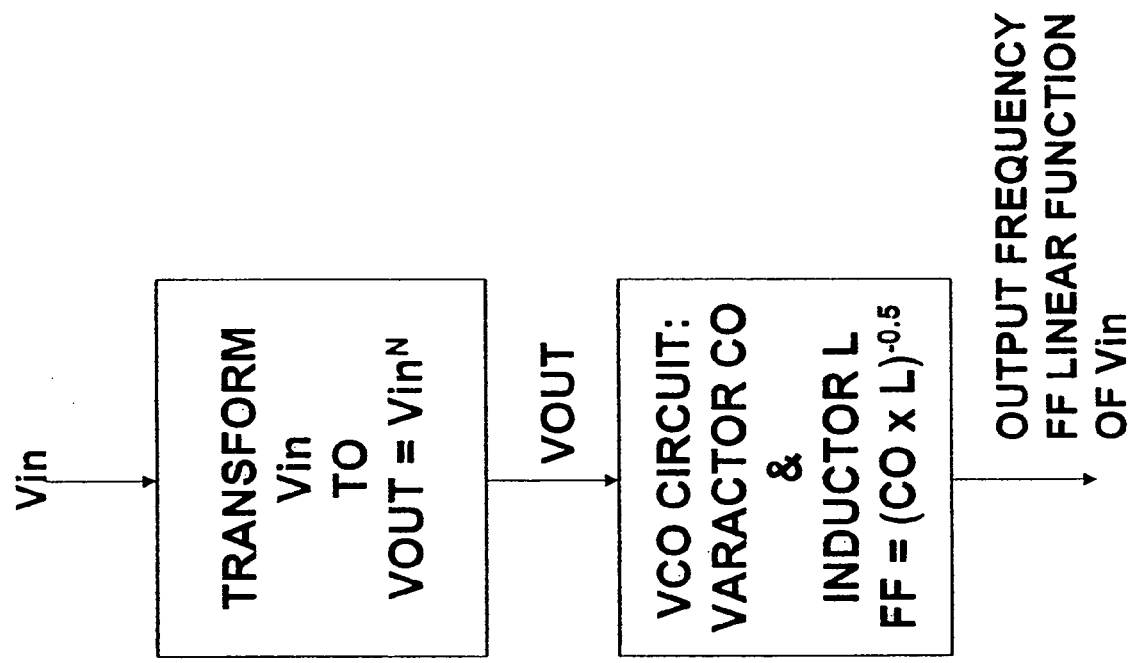

FIG. 11 shows a block diagram of one application of the invention. The upper box represents what takes place in the circuit shown in FIG. 9 and the lower box represents how the output of the circuit can be used to produce an output frequency utilizing a known varactor (CO) and a known Inductor (L). The diagram illustrates how a VCO circuit has an input voltage Vin which controls the capacitance value of a varactor CO. With an inductor L in parallel with the varactor CO, the output frequency FF is a function of the input voltage Vin. It is very desirable to have a linear relationship between the output frequency and the input voltage, and to have this linear range as large as possible. The idea is to transform this input voltage Vin to another voltage VOUT which has a power function relationship with Vin. The new voltage VOUT controls the capacitance value of the varactor CO.

Figure 12:
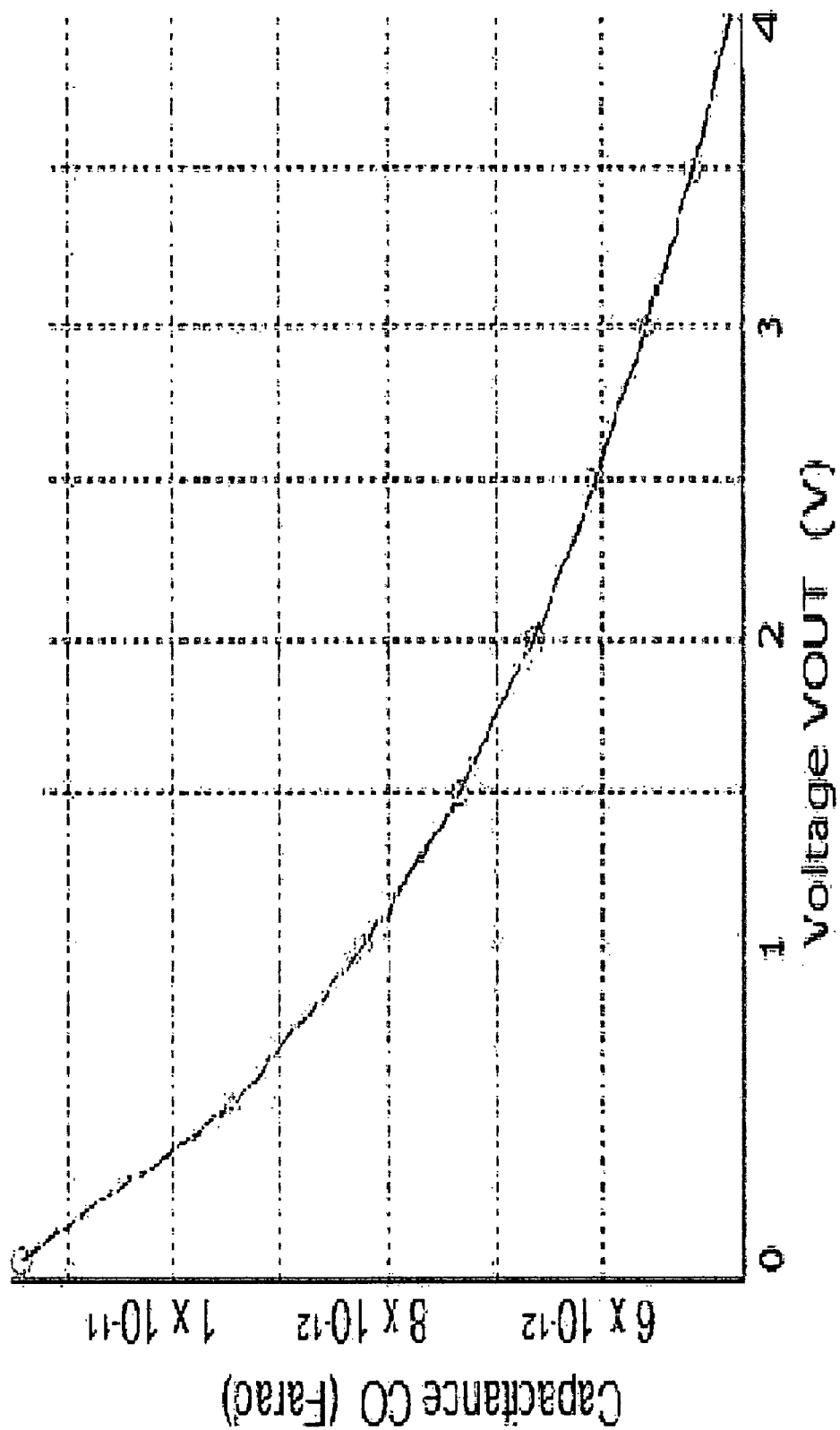
FIG. 12 graphically depicts varactor capacitance CO versus voltage VOUT according to the present invention.

The capacitance CO as a function of the voltage VOUT is shown in FIG. 12 for a typical varactor. The relationship between the varactor capacitance CO and voltage VOUT is neither linear, nor a power function. The output frequency FF is given by:

$$FF = (CO \times L)^{-0.5} \tag{14}$$

As the objective is to have a linear relationship between Vin and FF, this can be accomplished by adjusting the power index N in the relationship between Vin and VOUT as follows:

$$VOUT = C \times Vin^{N} \tag{15}$$

Several values for N can be utilized in an attempt to find the optimum value for the linear relationship between FF and CO.

Figure 13:
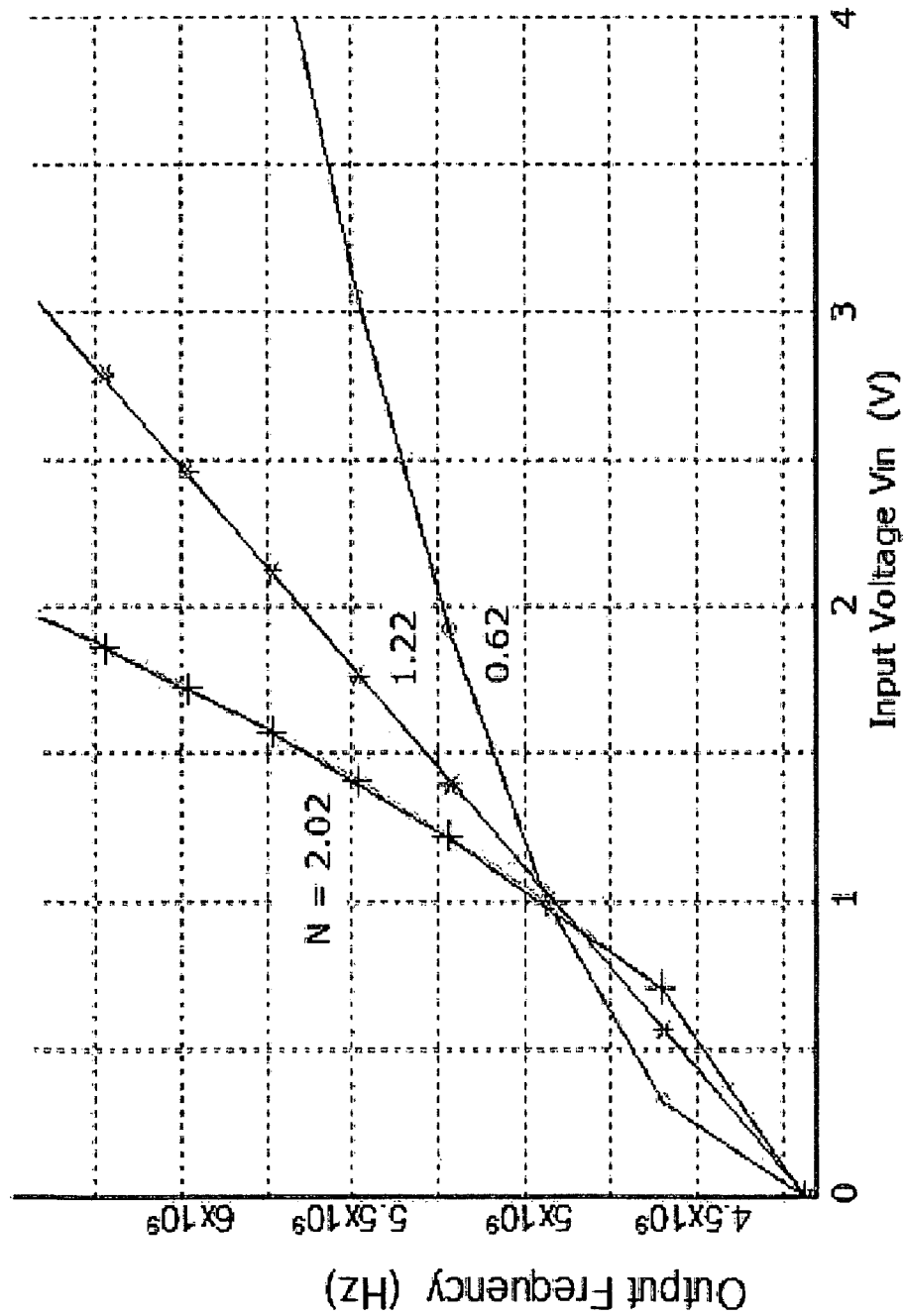
FIG. 13 graphically depicts output frequency in Hz versus input voltage Vin at inductance L=5 nH according to the present invention.

FIG. 13 shows the output frequency FF versus input voltage Vin for the an inductor L of 5 nH (nano-Henry) and utilizing different values of the power index N, i.e., N=0.62, N=1.22, and N=2.02. These results show that for N=1.22, there is an excellent linear relationship between FF and Vin. A non-linear relationship between FF and Vin result if N is lower, e.g., 0.62, or higher, e.g., 2.02, than the optimum value of 1.22.

The above optimum conditions for the output frequency FF versus input voltage Vin could be accomplished by adjusting the conditions for the circuit of FIG. 9. In this case, device NFET2 30 is not utilized and the total current IT is provided through device NFET1. 20 The oxide thickness TOX1 of NFET1 20 could be set to 1.9 nm. In this case, the current I1 is about 11.95 nA/um² (nano-amps per micro-meters squared) at an input voltage Vin of 1.5V. With an area A1 of 10 um² for NFET1, the current I1 is about 0.12 uA. The current IT is given by (in nano-amps nA):

$$IT = 22.9 \times Vin^{4075} \text{ nA} \tag{16}$$

With reference to FIG. 9, it can be seen that the current IT is mirrored out and the option of using NFET3 40 is employed here to produce the output voltage VOUT2. The oxide thickness TOX3 for NFET3 40 is set at 1.4 nm and the area A3 for NFET3 40 is 1 um².

The total current (IT) is then given by:

$$IT = 0.65 \times VOUT2^{3.3411} \text{ uA} \tag{17}$$

Thus, $$VOUT2 = 0.367 \times Vin^{1.22} \tag{18}$$

The general format for VOUT2 in this case can be given by:

$$VOUT2 = C4 \times Vin^{C5} \tag{19}$$

In this case, N is the same as C5. At an input voltage Vin of 1.5V, the output voltage VOUT2 is about 0.6V. The exponent of 1.22 in equation (18) is the desired power index to achieve linearity between the output frequency FF and the input voltage Vin.

A consideration of the invention relates to the sensitivity of the inventive procedure to process as well temperature variations. In the case of temperature variations, it should be noted that as temperature changes from 27° C. to −40° C., there is only about 0.15% change in the key power index C5 (equation 19). For temperature changes from 27° C. to 115° C., the change in C5 is only about −1%. The reasons why there is very little sensitivity to temperature include, for example, the tunneling current has a generally weak temperature dependence. Also, when the temperature increases, the power indices for the current dependence on voltage (C2 in equation 1) for both the TOX1 (1.9 nm) and TOX3 (1.4 nm), both decrease, which means that C5 changes only very slightly. At low temperatures, the power indices C2 for both TOX1 and TOX3 increases, again causing very little change in C5.

With regard to process variations, effects on the operability of the invention will be discussed with reference to the above example for a VCO which utilizes 1.9 nm for TOX1 and 1.4 nm for TOX3 (see FIGS. 14-19). Adequate process controls for controlling oxide thickness in advanced CMOS manufacturing should be able to control oxide thickness to ±7% of nominal value. This includes wafer to wafer variations and lot and lot as well across any wafer. TOX1 and TOX3 may not track in exactly the same way through their process variations. However, it is typically the case that when one oxide thickness, e.g., TOX1, is on the high side, the other oxide thickness, e.g., TOX3, is also on the high side. The same applies for variations on the low side of oxide thickness. It is highly unlikely that one oxide thickness, e.g., TOX1, would be on the high side, while the other oxide thickness, e.g., TOX3, is on the low side and vice versa. Thus, an issue to evaluate process effects is wherein TOX1 and TOX3 are both on the high side or both on the low side of thickness variations. High side here means an increase of TOX above nominal and low side means a decease of TOX below nominal value.

Figure 14:
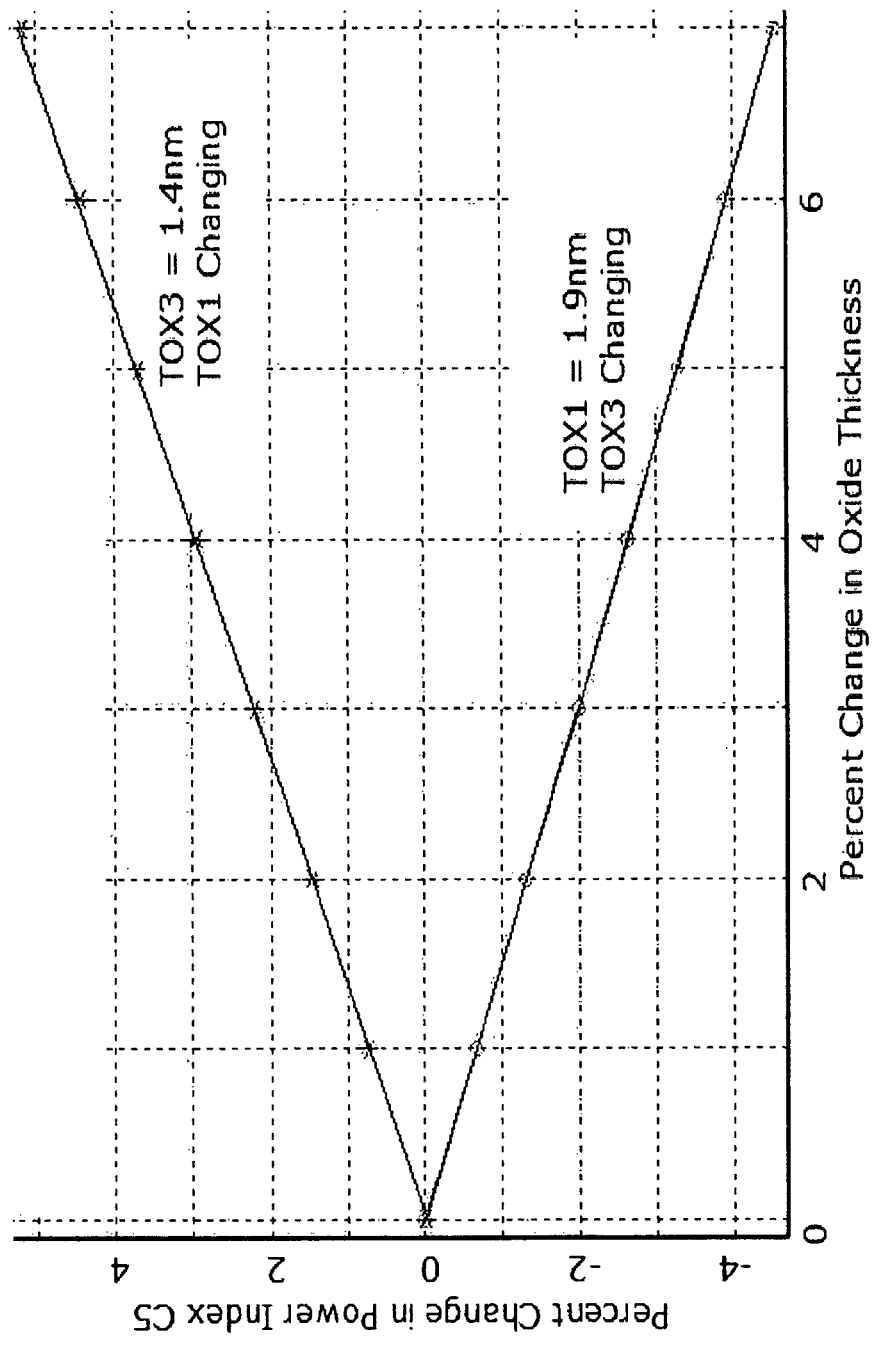
FIGS. 14-19 graphically depict percentage change in power index C5 versus percentage change in oxide thickness TOX1 or TOX3 according to the present invention.

Sensitivity to oxide thickness variations is demonstrated under several conditions in FIG. 14-19. FIG. 14 shows what happens when TOX1 (or TOX3) is at nominal value while the other oxide thickness TOX3 (or TOX1) varies above nominal by up to about +7%. The graph shows that the end result is a maximum of only about ±5% change in the key power index C5.

Figure 15:
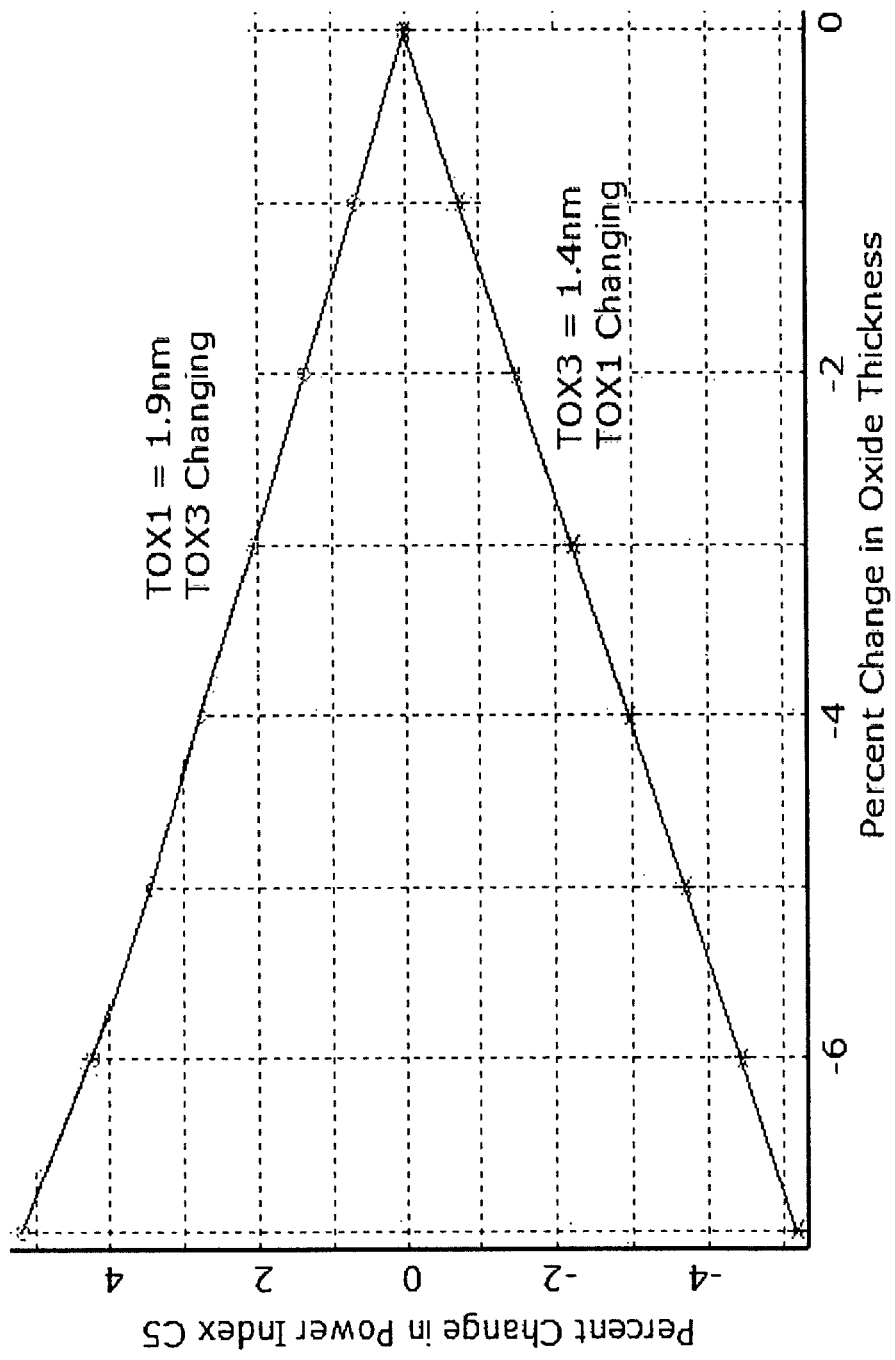

FIG. 15 shows what happens when TOX1 (or TOX3) is below nominal of up to −7% while the other oxide thickness TOX3 (or TOX!) is at nominal. The graph shows that the variation in C5 is also about 5% change in magnitude. As explained above, TOX1 and TOX3 are more likely to be both on the high side or both on the low side.

Figure 16:
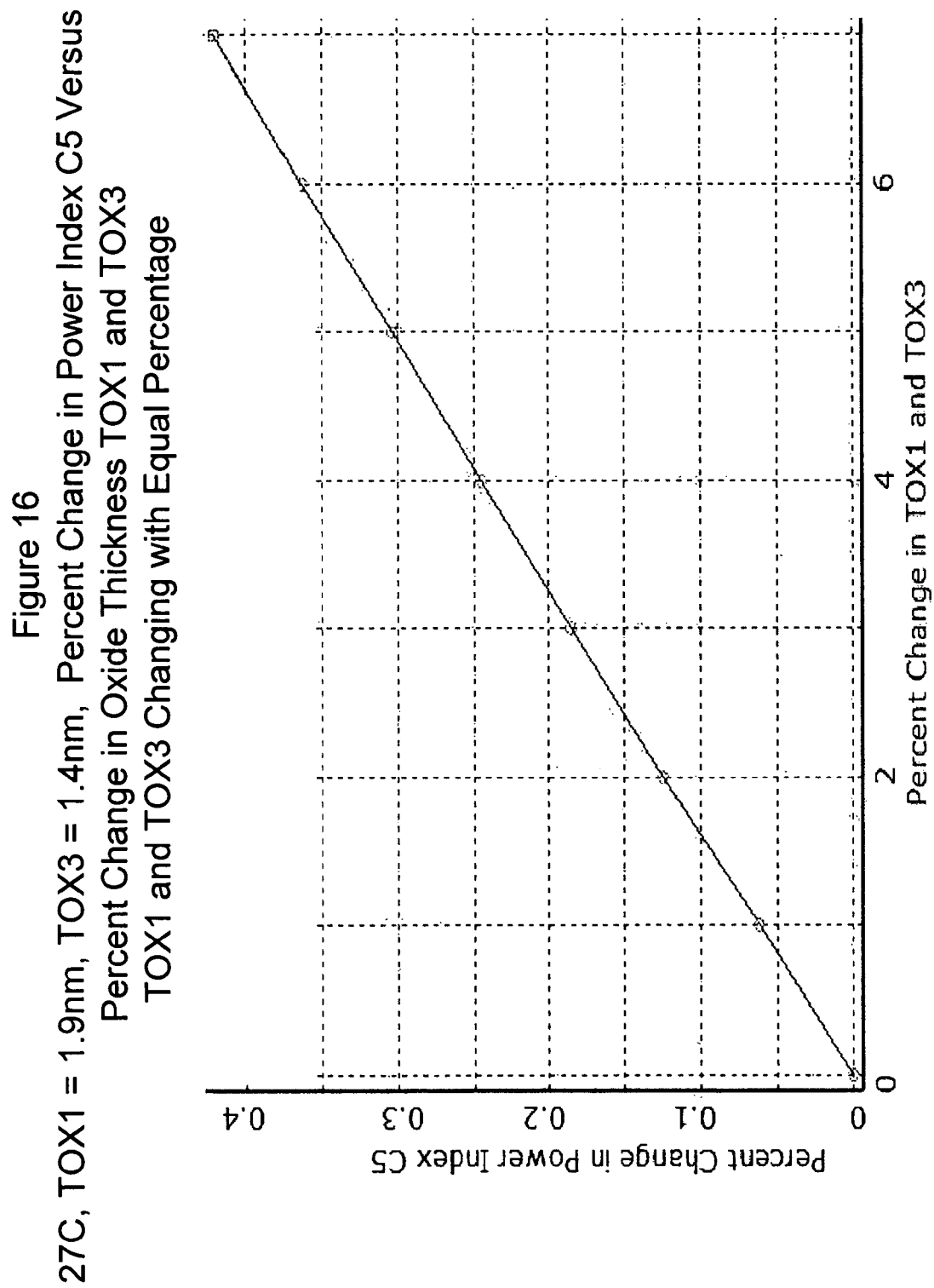
Figure 17:
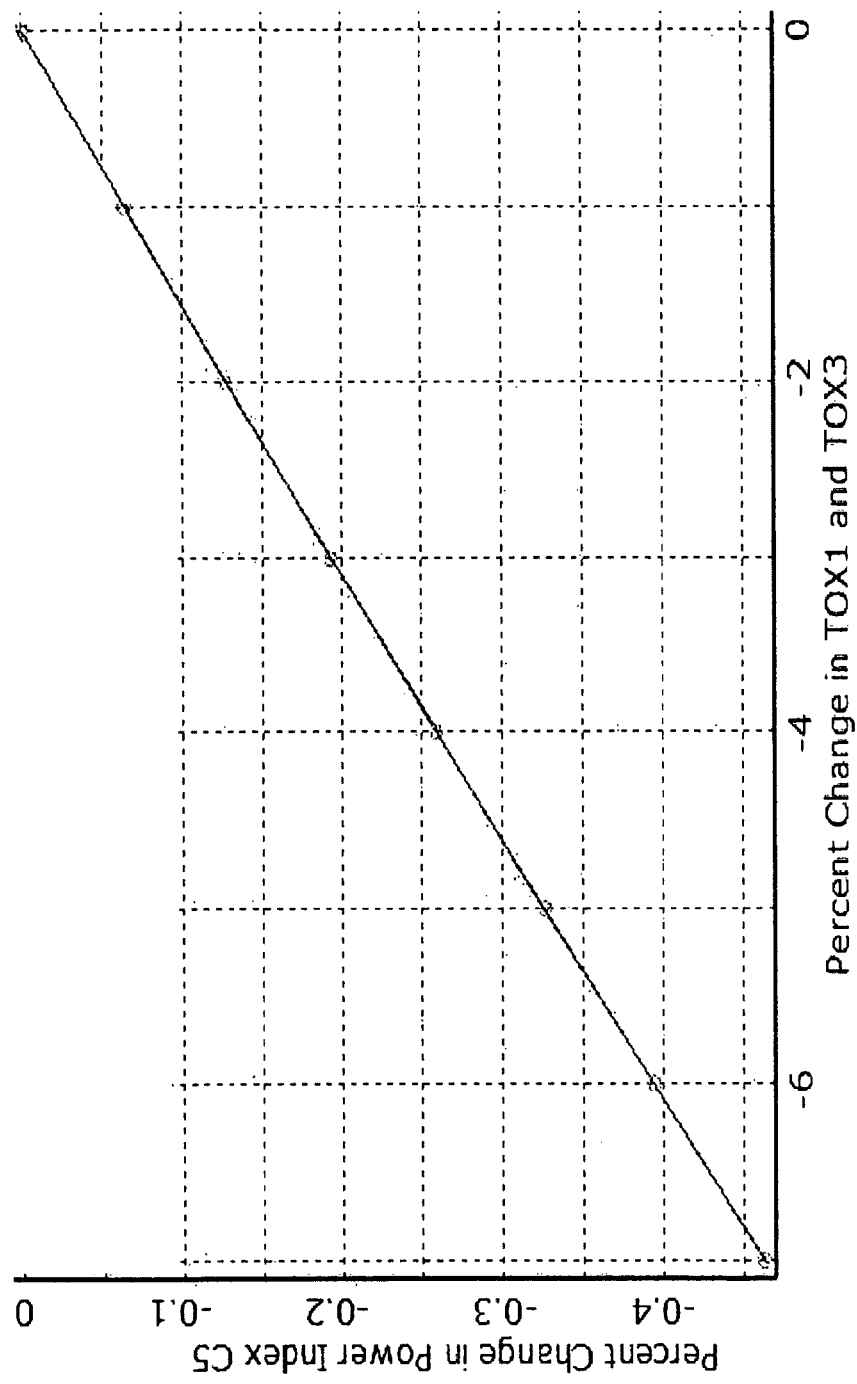

FIG. 16 shows what happens when both TOX1 and TOX3 are above nominal values of up to about +7%. FIG. 17 shows what happens when both TOX1 and TOX3 are below nominal values of up to about −7%. In both cases, the change in the power index C5 is less than about 0.5% in magnitude, which demonstrates the excellent performance of the procedure according to the invention in dealing with typical or realistic process variations.

Figure 18:
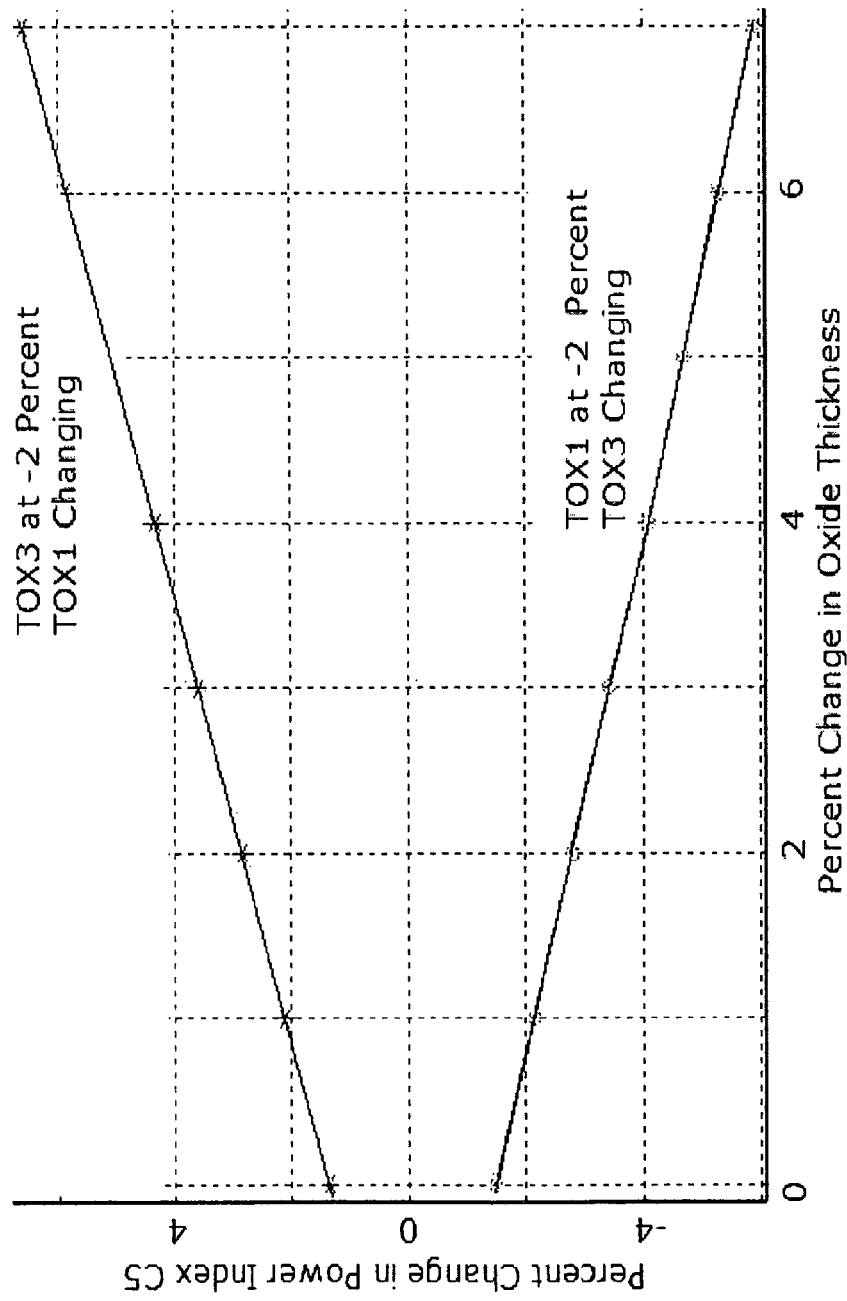
Figure 19:
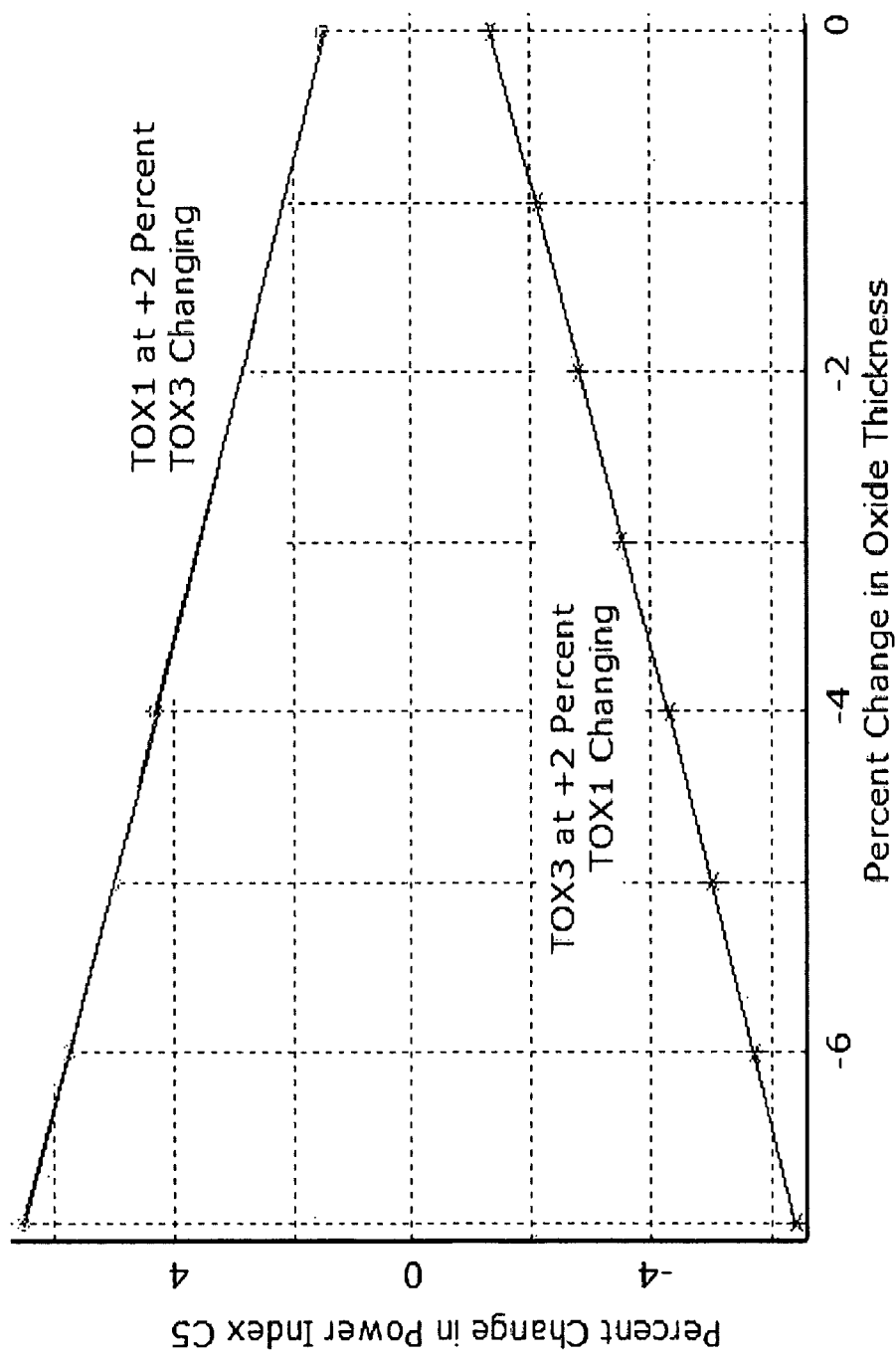

Although less likely to occur, FIG. 18 shows what happens when TOX1 (or TOX3) is at about −2% below nominal value while the other thickness TOX3 (or TOX1) is above nominal value by up to +7%. FIG. 19 shows what happens when TOX1 (or TOX3) is at +2% above nominal while the other oxide thickness TOX3 (or TOX1) is below nominal value of up to −7%. In both cases, the variations in the power index C5 is under about 6% in magnitude.

The above results show very good performance of the inventive technique in dealing with both temperature and process variations.

Design Structure

Figure 20:
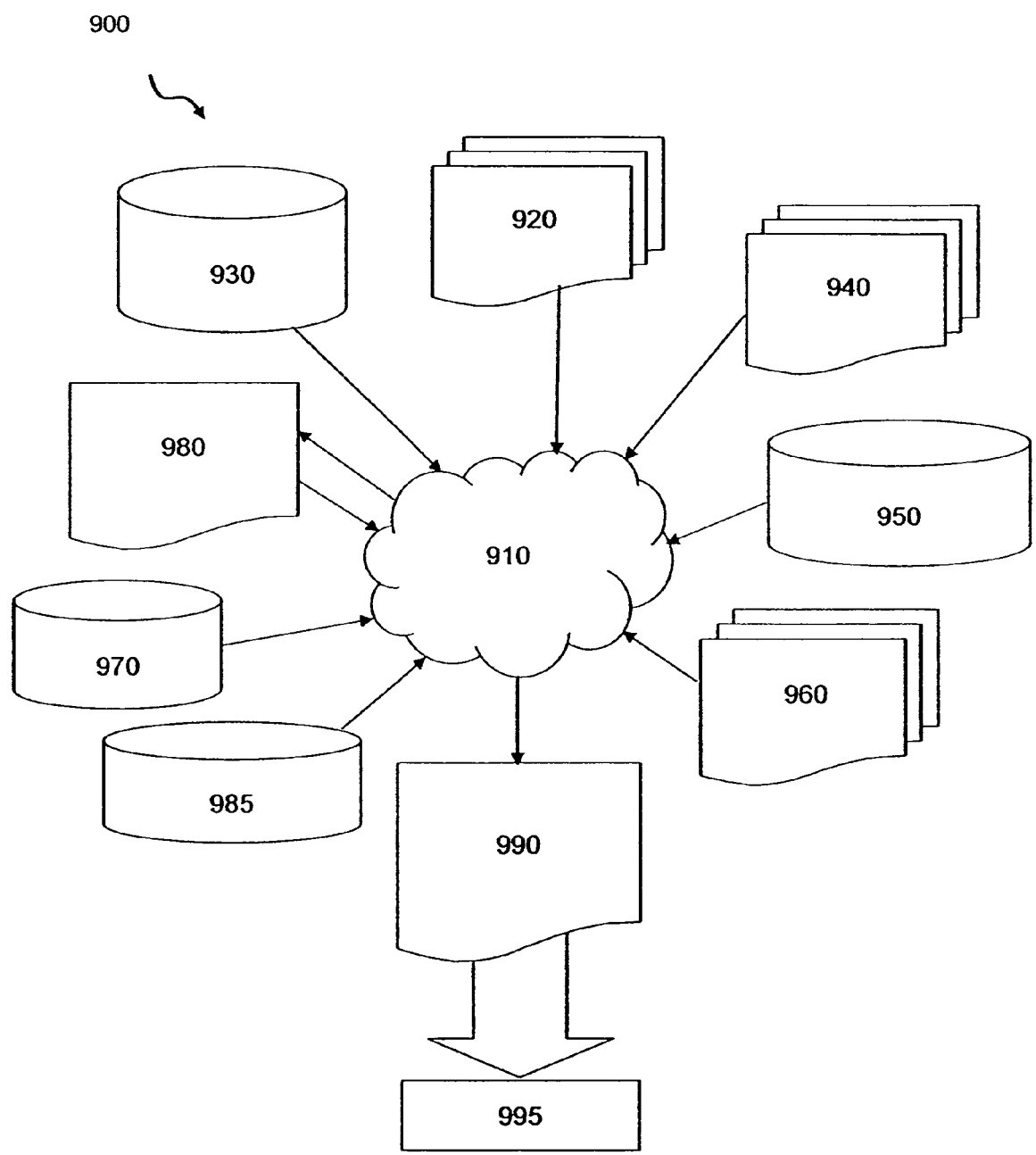
FIG. 20 is a flow diagram of a design process used in semiconductor design, manufacture, and/or test.

FIG. 20 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component or from a design from 900 for instantiating the design into a programmable array, for example a programmable gate array (PGA) or a field programmable gate array (FPGA) offered by Altera® Inc. or Xilinx® Inc. Design structure 920 is preferably an input to a design process 910 and may come from an IP provider, a core developer, or other design company or may be generated by the operator of the design flow, or from other sources. Design structure 920 comprises an embodiment of the invention as shown in, e.g., FIGS. 9-11, in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in, e.g., FIGS. 9-11. Design process 910 preferably synthesizes (or translates) an embodiment of the invention as shown in, e.g., FIGS. 9-11 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in, e.g., FIGS. 9-11, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in, FIGS. 9-11. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of embodiments, those of skill in the art will recognize that the invention can be practiced with modifications and in the spirit and scope of the appended claims.

What is claimed is:

1. A structure for linearizing an input voltage to an output frequency response of a voltage controlled oscillator (VCO), the structure comprising:
   a first structure for determining an output voltage that is a non-linear characteristic of the input voltage applied to the first structure, to linearize the input voltage to the output frequency response of the VCO, the first structure providing a tunneling-based current relationship with the input voltage, and the output voltage being used in the VCO as a control voltage of the VCO.

2. The structure of claim 1, wherein a relationship is developed between the input voltage and the output frequency response of the VCO.

3. The structure of claim 1, wherein a design structure of the structure is embodied in a non-transitory machine readable medium.

4. The structure of claim 1, wherein the structure comprises a circuit.

5. The structure of claim 1, wherein the input voltage is transformed to obtain linearity between input and output functions of a circuit or a system associated with the input voltage.

6. The structure of claim 1, wherein the structure is embodied as a circuit which utilizes at least one of NFETs and PFETs.

7. The structure of claim 1, wherein the structure is embodied as a circuit which utilizes devices having ultra-thin gate oxides biased in inversion or accumulation mode conditions.

8. The structure of claim 1, further comprising a varactor and an inductor structured and arranged to produce the output frequency response.

9. The structure of claim 1, wherein the first structure comprises:
   a unity gain op-amp, the input voltage applied to a negative terminal of the unity gain op-amp;
   a pass gate connected to an output terminal of the unity gain op-amp;
   a first NFET and a second NFET connected to the pass gate operable to supply a first tunnel current to the first NFET and a second tunnel current to the second NFET, the pass gate operable to apply a reference voltage to a positive terminal of the unity gain op-amp;
   a PFET connected to the output terminal of the unity gain op-amp; and
   an output load connected to the PFET operable to supply a total tunnel current to the output load, to determine the output voltage, the output voltage expressed as a power function of the input voltage.

10. A method for linearizing an input voltage to an output frequency response of a voltage controlled oscillator (VCO), the method comprising:
    determining an output voltage that is a non-linear characteristic of the input voltage applied to a first structure, to linearize the input voltage to the output frequency response of the VCO;
    providing a tunneling-based current that is related to the input voltage;
    using the output voltage in the VCO as a control voltage of the VCO; and
    establishing a relationship between the input voltage and the output frequency response of the VCO.

11. The method of claim 10, further comprising utilizing a non linear functional dependency of gate tunneling current for ultra-thin gate oxide on gate voltage.

12. The method of claim 10, further comprising:
    applying a gate voltage to a gate of an ultra-thin gate oxide device in order to cause a gate tunneling current, whereby the gate tunneling current is expressed as a power function of the applied gate voltage.

13. The method of claim 10, further comprising controlling an exponent or index of a power function.

14. The method of claim 13, wherein at least one of:
    the controlling comprises varying an oxide thickness; and
    the controlling comprises summing currents from more than one tunneling device and subject to a same input gate voltage.

15. The method of claim 10, further comprising varying an oxide area ratio of plural tunneling devices to control a power index of an output current.

16. The method of claim 10, further comprising applying a load current to an output load, whereby the output voltage is expressed as a power function of the input voltage.

17. The method of claim 10, further comprising:
    transforming a functional form of the output voltage; and
    utilizing the output voltage in a VCO circuit,
    wherein the output voltage is used as a control voltage of the VCO circuit and an output frequency of the VCO circuit is linear with the input voltage applied to the first structure.

18. The method of claim 10, further comprising:
    applying the input voltage to a negative terminal of a unity gain op-amp;
    applying an output voltage of the unity gain op-amp to a pass gate and a PFET;
    supplying a first tunnel current of the pass gate to a first NFET;
    supplying a second tunnel current of the pass gate to a second NFET;
    applying a reference voltage of the pass gate to a positive terminal of the unity gain op-amp; and
    supplying a total tunnel current to an output load, to determine the output voltage, the output voltage expressed as a power function of the input voltage.

19. A method in a computer-aided design system for generating a functional design model of an integrated circuit, the method comprising: generating, by a processor, a functional representation of a structure for linearizing an input voltage to an output frequency response of a voltage controlled oscillator (VCO) and for determining an output voltage that is a non-linear characteristic of the input voltage applied to the structure, to linearize the input voltage to the output frequency response of the VCO, the structure providing a tunneling-based current relationship with the input voltage, and the output voltage being used in the VCO as a control voltage of the VCO.

20. The method of claim 19, wherein the functional design model comprises a netlist.

21. The method of claim 19, wherein the functional design model resides on storage medium as a data format used for the exchange of layout data of integrated circuits.

22. The method of claim 19, wherein the functional design model resides in a programmable gate array.

23. The method of claim 19, further comprising:
generating a functional representation of a unity gain op-amp, the input voltage applied to a negative terminal of the unity gain op-amp;
generating a functional representation of a pass gate connected to an output terminal of the unity gain op-amp;
generating a functional representation of a first NFET and a second NFET connected to the pass gate operable to supply a first tunnel current to the first NFET and a second tunnel current to the second NFET, the pass gate operable to apply a reference voltage to a positive terminal of the unity gain op-amp;
generating a functional representation of a PFET connected to the output terminal of the unity gain op-amp; and
generating a functional representation of an output load connected to the PFET operable to supply a total tunnel current to the output load, to determine the output voltage, the output voltage expressed as a power function of the input voltage.

* * * * *